US008239807B2

(12) United States Patent
Arora et al.

(10) Patent No.: US 8,239,807 B2
(45) Date of Patent: Aug. 7, 2012

(54) METHOD OF MAKING ROUTABLE LAYOUT PATTERN USING CONGESTION TABLE

(75) Inventors: Pankaj Arora, Delhi (IN); Tarun Gupta, Bangalore (IN); Manoj Singh, Pune (IN)

(73) Assignee: Freescale Semiconductor, Inc, Austin, TX (US)

( * ) Notice: Subject to any disclaimer, the term of this patent is extended or adjusted under 35 U.S.C. 154(b) by 218 days.

(21) Appl. No.: 12/791,794

(22) Filed: Jun. 1, 2010

(65) Prior Publication Data

US 2011/0296366 A1   Dec. 1, 2011

(51) Int. Cl.
*G06F 17/50* (2006.01)

(52) U.S. Cl. .......................... 716/126; 716/119; 716/135

(58) Field of Classification Search .................. 716/119, 716/126, 135
See application file for complete search history.

(56) References Cited

U.S. PATENT DOCUMENTS

| | | | | |
|---|---|---|---|---|
| 5,587,923 A | * | 12/1996 | Wang | 716/129 |
| 5,737,236 A | * | 4/1998 | Maziasz et al. | 716/123 |
| 6,026,220 A | | 2/2000 | Cleereman | |
| 7,200,827 B1 | * | 4/2007 | Ku et al. | 716/123 |
| 7,984,397 B2 | * | 7/2011 | Lin et al. | 716/100 |
| 2009/0024977 A1 | | 1/2009 | Hetzel | |
| 2010/0050146 A1 | | 2/2010 | Frankle | |

OTHER PUBLICATIONS

Yang et al.; "Routability-Driven White Space Allocation for Fixed-Die Standard-Cell Placement"; IEEE transaction on computer-aided design of integrated circuits and systems, vol. 22, No. 4; Apr. 2003; pp. 410-419.*

* cited by examiner

*Primary Examiner* — Naum Levin
(74) *Attorney, Agent, or Firm* — Charles Bergere

(57) ABSTRACT

A method for generating a standard cell layout pattern for standard cell placement in an integrated circuit uses a congestion map. First, congestion zones are identified in a congestion map generated by an Electronic Design Automation (EDA) application. Next, routing tracks data corresponding to bounding boxes belonging to the congestion zones are used to calculate values of average vertical and horizontal congestion. Subsequently, a value of modified standard cell density is calculated based on the values of average vertical and horizontal congestion, and an unmodified standard cell density. The dimensions of a layout pattern unit are calculated using the value of the modified standard cell density and the width of standard cells. Various layout pattern units then are placed adjacent to one another to form a standard cell layout pattern.

9 Claims, 7 Drawing Sheets

METHOD OF MAKING ROUTABLE LAYOUT PATTERN USING CONGESTION TABLE

BACKGROUND OF THE INVENTION

The present invention relates generally to integrated circuits (ICs) and more particularly, to generating a routable layout pattern for placement of standard cells in an IC.

An IC layout pattern illustrates the placement positions of standard cells, including transistors, capacitors and the like, and the routing of interconnections (signal nets) between the standard cells. As a result of advances in the semiconductor technology, the complexity of ICs has increased considerably over the years such that contemporary ICs may contain several million transistors.

To design ICs having high degrees of complexity, various Electronic Design Automation (EDA) tools have been developed to automate the IC design process. Typically, the IC design process begins with an IC designer representing a logical IC design in the form of a netlist, i.e., a list of standard cells and nets interconnecting the standard cells. Thereafter, an EDA tool is used to place and route the standard cells, translating the logical IC design into a physical IC design, also known as a layout pattern. The IC designer specifies the value of standard cell density within a region of the IC. The value of standard cell density specified is such to prevent the occurrence of congestion zones or congestion hotspots in the IC layout design. However, though the EDA tool distributes standard cells ensuring the specified average standard cell density over the region of the IC, there may be localized zones within the IC that have a standard cell density in excess of the density specified by the IC designer. These localized regions of high standard cell density are sites having less available routing resources (routing tracks) as compared to the routing resources required. Examples of layout patterns are depicted and explained below in conjunction with FIGS. 1A and 1B.

One solution to the problem of formation of localized congestion hot spots is to ensure an even distribution of standard cells. An even distribution may be achieved using layout patterns as depicted in FIGS. 1A and 1B. FIGS. 1A and 1B illustrate schematic diagrams of conventional layout patterns 100 and 106. The conventional layout patterns 100, 106 include several placement regions 102 and several keep-out regions 104. Standard cells are placed in the placement regions 102 and the nets (interconnections) are routed through the keep-out regions 104. The layout pattern 100 depicted in FIG. 1A is known as a checkerboard pattern and the layout pattern 106 depicted in FIG. 1B is known as a diagonal keep-out layout pattern. It may be noted that alternating the placement regions 102 with keep-out regions 104 ensures an even standard cell density, which prevents the occurrence of congestion hot spots.

Though, the occurrence of localized congestion zones is prevented by the use of the above-described layout patterns, it is a difficult task to specify a standard cell density that ensures routability or a congestion free design. An inexperienced IC designer may require multiple iterations before realizing a layout pattern that is congestion free. To obtain a routable design, the IC designer inputs a value of standard cell density, such as 85%, to the EDA tool. The EDA tool generates a layout pattern based on the specified density value. The layout pattern is then observed for congestion zones. For example, if congestion zones are observed, the standard cell density is decreased by a suitable value, such as 5%, and the layout pattern is regenerated and analyzed for congestion zones. These steps are repeated until routability is obtained. Thus, the process of designing a congestion free layout pattern is a time-consuming, iterative process. It would be advantageous to be able to create a congestion free layout pattern without having to manually perform multiple layout iterations.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1B:
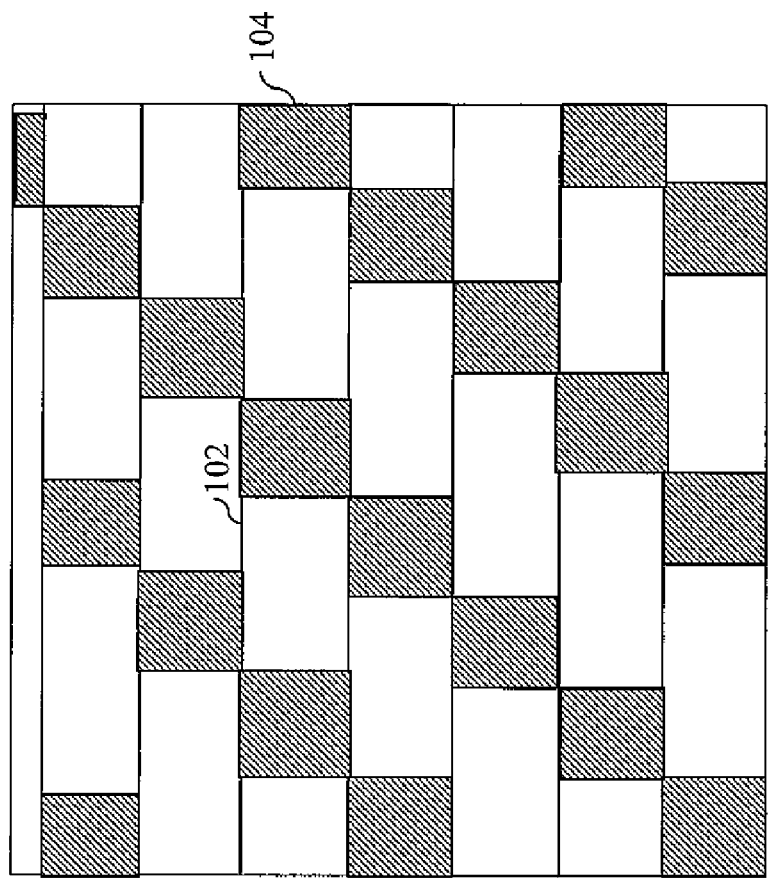
FIGS. 1A and 1B are schematic diagrams illustrating conventional layout patterns.
Figure 1A:
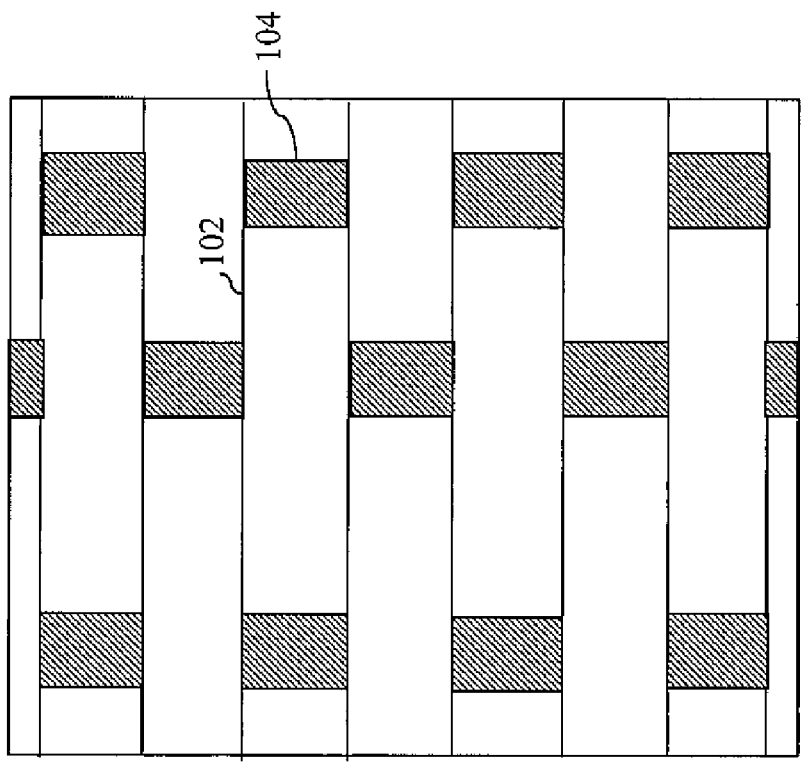

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for generating a standard cell layout pattern for standard cell placement in an integrated circuit is provided. The method includes identifying congestion zones in a congestion map. The congestion map is generated by an EDA application and includes various bounding boxes. Further, the EDA application provides routing tracks data corresponding to each bounding box. Subsequent, to identifying congestion zones, values of average vertical congestion and average horizontal congestion corresponding to each congestion zone are calculated. The values of average vertical and average horizontal congestions are calculated using the routing tracks data that corresponds to each of the bounding boxes belonging to the various congestion zones. Thereafter, a value of a modified standard cell density for various congestion zones is calculated using the corresponding values of average vertical congestion, average horizontal congestion, and unmodified standard cell density. The value of the unmodified standard cell density is provided by the EDA application and corresponds to the standard cell density in the congestion zone prior to the implementation of the method suggested by the present invention. Subsequently, dimensions of a layout pattern unit are calculated. The layout pattern unit includes a keep-out region and a placement region. The standard cells are placed in the placement region and the keep-out region includes routing tracks. Further, various layout pattern units are arranged to form the standard cell layout pattern. The layout pattern units are arranged so that at least one routing track in a keep-out region of a first layout pattern unit overlaps with at least one routing track in a keep-out region of a second layout pattern unit.

In an embodiment of the present invention, a method for generating a standard cell layout pattern for standard cell placement in an integrated circuit is provided. The method includes identifying congestion zones in which each congestion zone includes one or more bounding boxes. The routing tracks corresponding to each bounding box are used to calculate a modified standard cell density. The routing tracks data includes counts of vertical and horizontal routing tracks remaining subsequent to routing a desired number of nets and the total number of routing tracks that are available. A negative value of the count of vertical and/or horizontal tracks remaining symbolizes a shortage of routing tracks in the particular direction. The value of the modified standard cell density calculated using the above mentioned data is the desired standard cell density value needed to ensure routability in the congestion zone under consideration.

The iterative process of obtaining a standard cell density that ensures routability in a congestion zone has been eliminated. The standard cell density ensuring routability may be obtained in a single cycle using the method disclosed herein, which reduces design cycle time. Further, the desired standard cell density may be calculated by an inexperienced IC designer, whereas the prior art iterative procedures required a seasoned IC designer for modifying a beginning value or defining a decrement value of the standard cell density to be used in ensuing iterations. Further, the mathematical foundation of the suggested method insures that the calculated standard cell density is relevant and corresponds to a maximum number of standard cells that may be accommodated while ensuring routability. This allows for complete utilization of the die space.

The modified standard cell density and the horizontal and vertical routing tracks data are thereafter used to calculate dimensions (lengths of the keep-out and placement regions) of the layout pattern units. The use of the horizontal and vertical routing tracks data in dimensions calculation provides sensitivity to directional congestion, i.e., horizontal congestion and/or vertical congestion. Therefore, the horizontal and the vertical dimensions of the calculated layout pattern units are effective in addressing the type of congestion, i.e. vertical and/or horizontal prevailing in the congestion zone.

Figure 2:
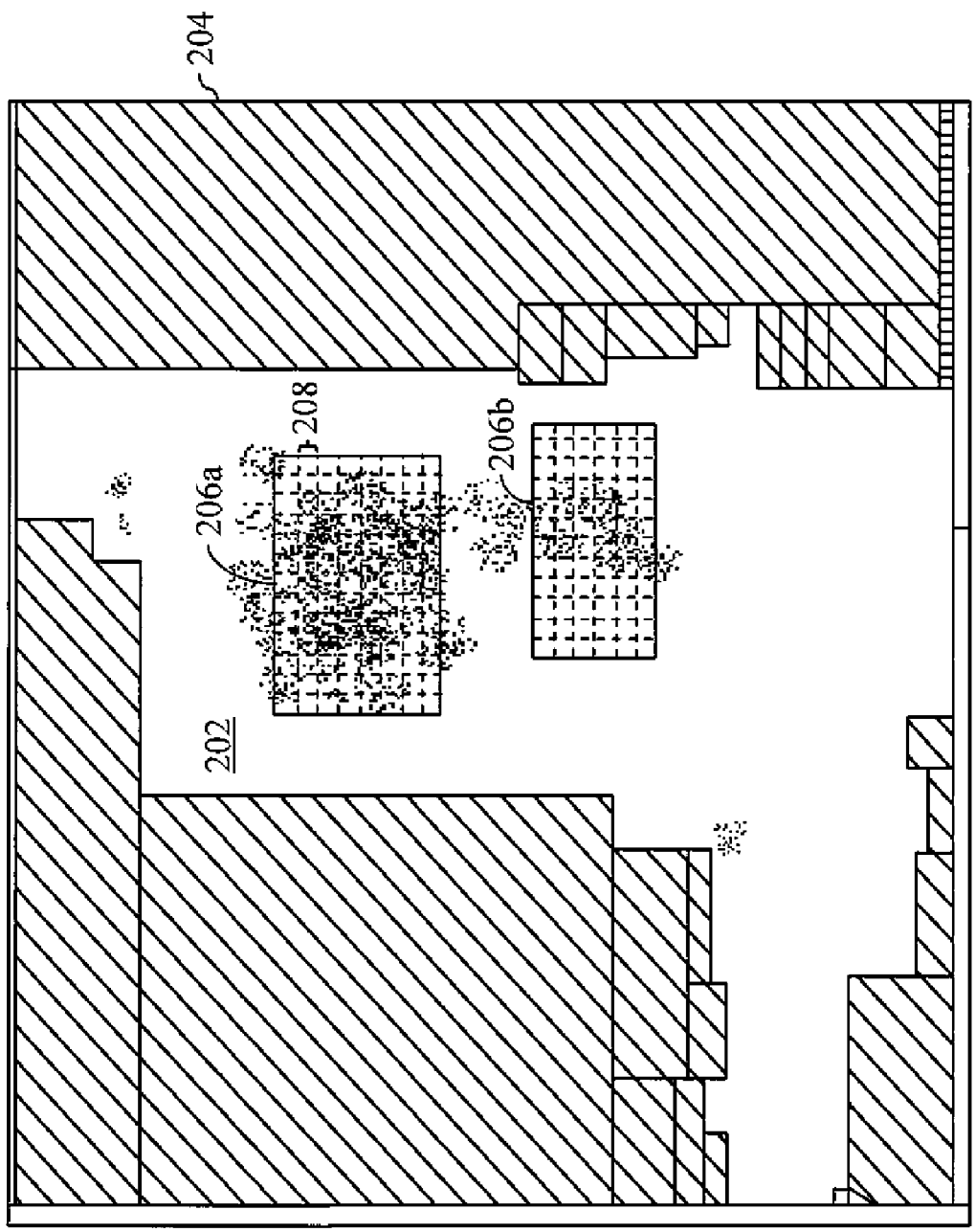
FIG. 2 is a schematic diagram illustrating a congestion map in accordance with an embodiment of the present invention.

Referring now to FIG. 2, a schematic diagram illustrating a congestion map 200 in accordance with an embodiment of the present invention is shown. The congestion map 200 includes a firm functional block 202 and a hard functional block 204. The firm functional block 202 includes congestion zones 206a and 206b. The congestion zones 206a and 206b include several bounding boxes such as a bounding box 208. In an embodiment of the present invention, the congestion zones are identified by visual observation of a congestion map generated by an EDA tool. EDA tools capable of generating congestion maps are generally commercially available, one example being Cadence® SoC Encounter™.

The firm functional block 202 may be designed either manually or automatically (using an EDA tool) using cells from a standard cell library. The standard cells can range from logic gates, such as AND gates, OR gates, and the like to simple metal programmable structures, such a Phase Locked Loops (PLLs). Further, designing the hard functional block 204 includes an automatic generation of a macro function such as a Random Access Memory (RAM) or a Microprocessor Unit (MPU). Various embodiments of the present invention are directed toward the synthesis of the firm functional block 202. However, with suitable modifications, the embodiments of the present invention may be used for designing the hard functional block 204.

The congestion zones 206a and 206b have a shortage of routing resources. The routing resources include horizontal and vertical routing tracks through which the nets that interconnect the standard cells are routed. In regions with a shortage of routing resources, such as the congestion zones 206a and 206b, the number of vertical or horizontal tracks required is greater than the number of vertical or horizontal tracks available. The congestion may be relieved by decreasing the standard cell density in the congestion zones to a value such that there is no mismatch between the number of horizontal and vertical routing tracks required and the routing tracks available. The method followed for calculating the value of standard cell density that eliminates the congestion in the congestion zones 206a and 206b will be explained in detail in conjunction with FIGS. 2, 3, 4A-4D, and 5.

Figure 3A:
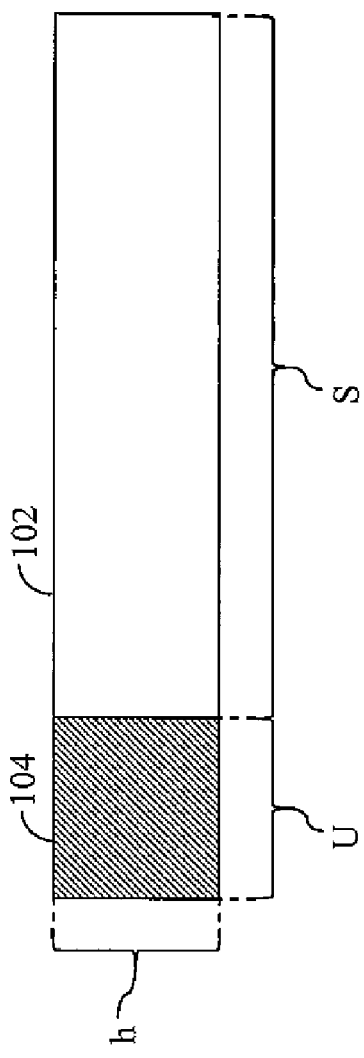
FIG. 3A is a schematic diagram illustrating a layout pattern unit in accordance with an embodiment of the present invention.
Figure 3B:
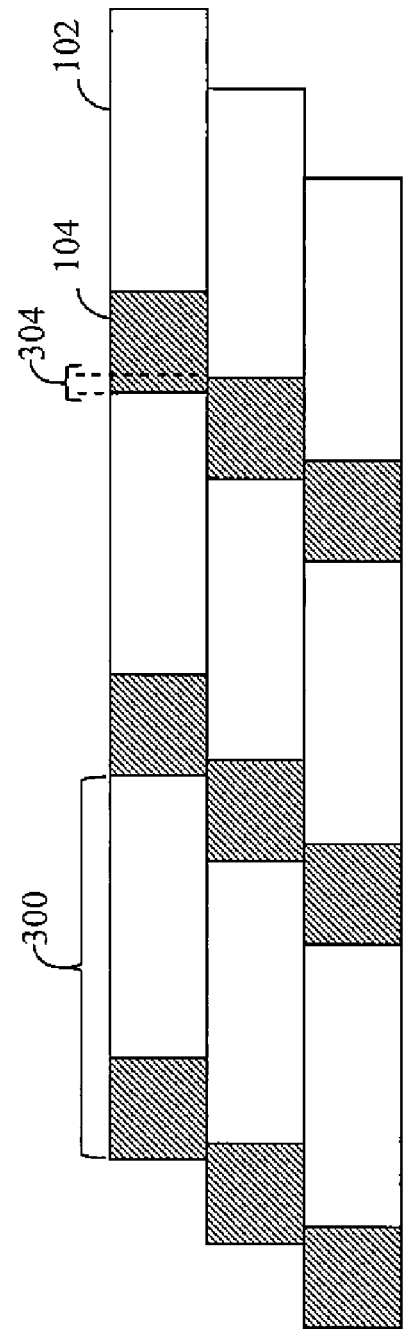
FIG. 3B is a schematic diagram illustrating a partial layout pattern unit in accordance with an embodiment of the present invention.

Referring now to FIG. 3A, a schematic diagram of a layout pattern unit 300 is shown in accordance with an embodiment of the present invention. The layout pattern unit 300 includes placement region 102 and keep-out region 104. FIG. 3B illustrates a partial layout pattern 302 that includes several layout pattern units 300. The partial layout pattern 302 also includes overlap widths 304.

More specifically, the placement region 102 has a length 'S' for receiving standard cells. The keep-out region 104 has a length 'U' for horizontal and vertical tracks for routing nets that interconnect the standard cells. The keep-out region 104 does not include any standard cells. The method for calculation of the lengths 'U' and 'S' will be explained in conjunction with FIG. 5. The width of the layout pattern unit 300 is 'h', which preferably is equal to the width of a standard cell. It should be realized by persons skilled in the art that the width of a standard cell is dependant on the technology and is the same for standard cells based on a particular technology. Examples of technologies on which the standard cells are based are 130 nm, 90 nm, and so forth.

Multiple ones of the layout pattern unit 300 are placed adjacent to one another to form the partial layout pattern 302. The layout pattern units 300 are placed such that the overlap width 304 includes at least one routing track of a keep-out region 104. Placement of the layout pattern units 300 at an angle with respect to one other enables traversal of a signal from one corner of one partial layout pattern 302 to another.

Figure 4A:
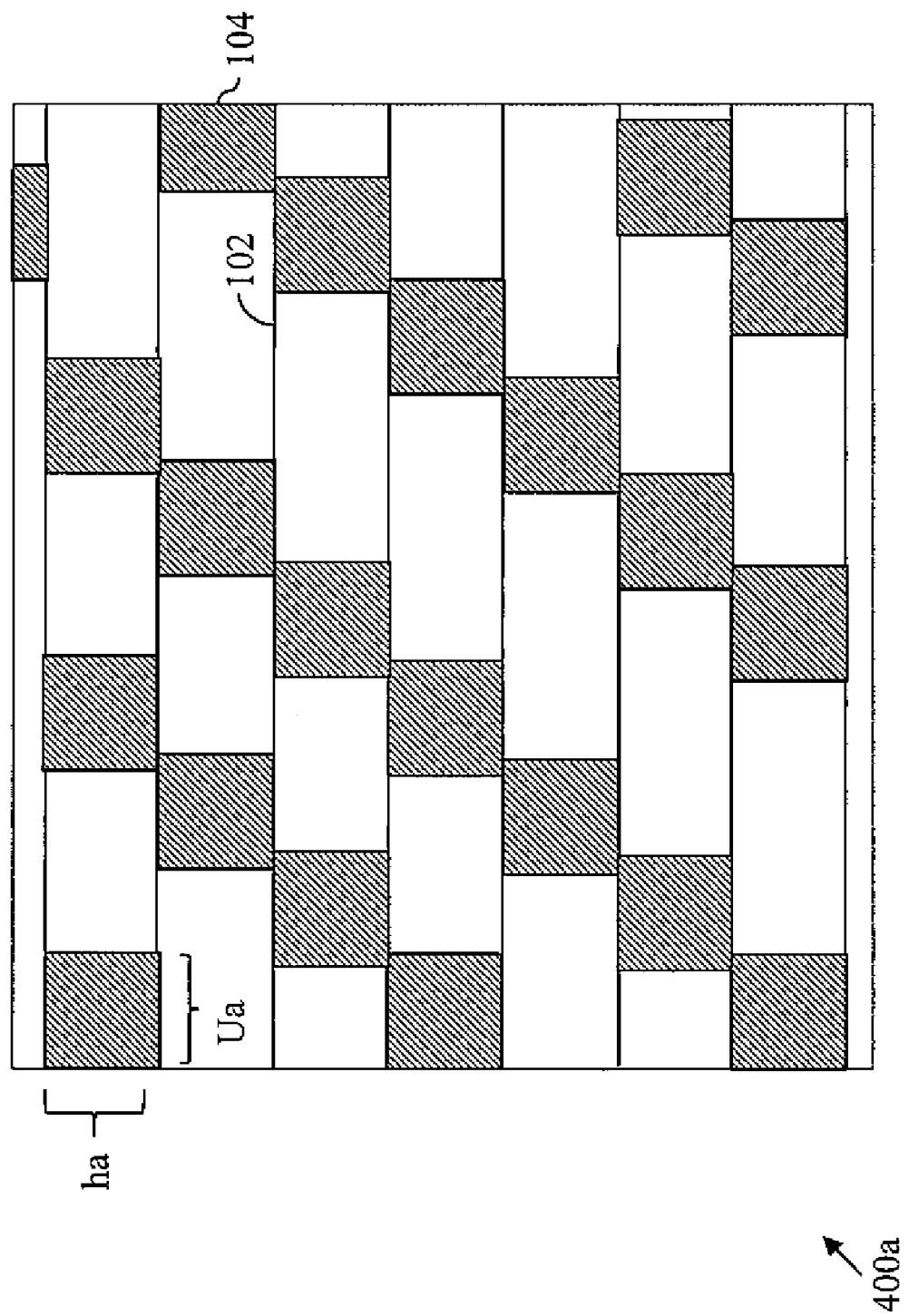
FIGS. 4A, 4B, and 4C are schematic diagrams illustrating layout patterns in accordance with an embodiment of the present invention.
Figure 4B:
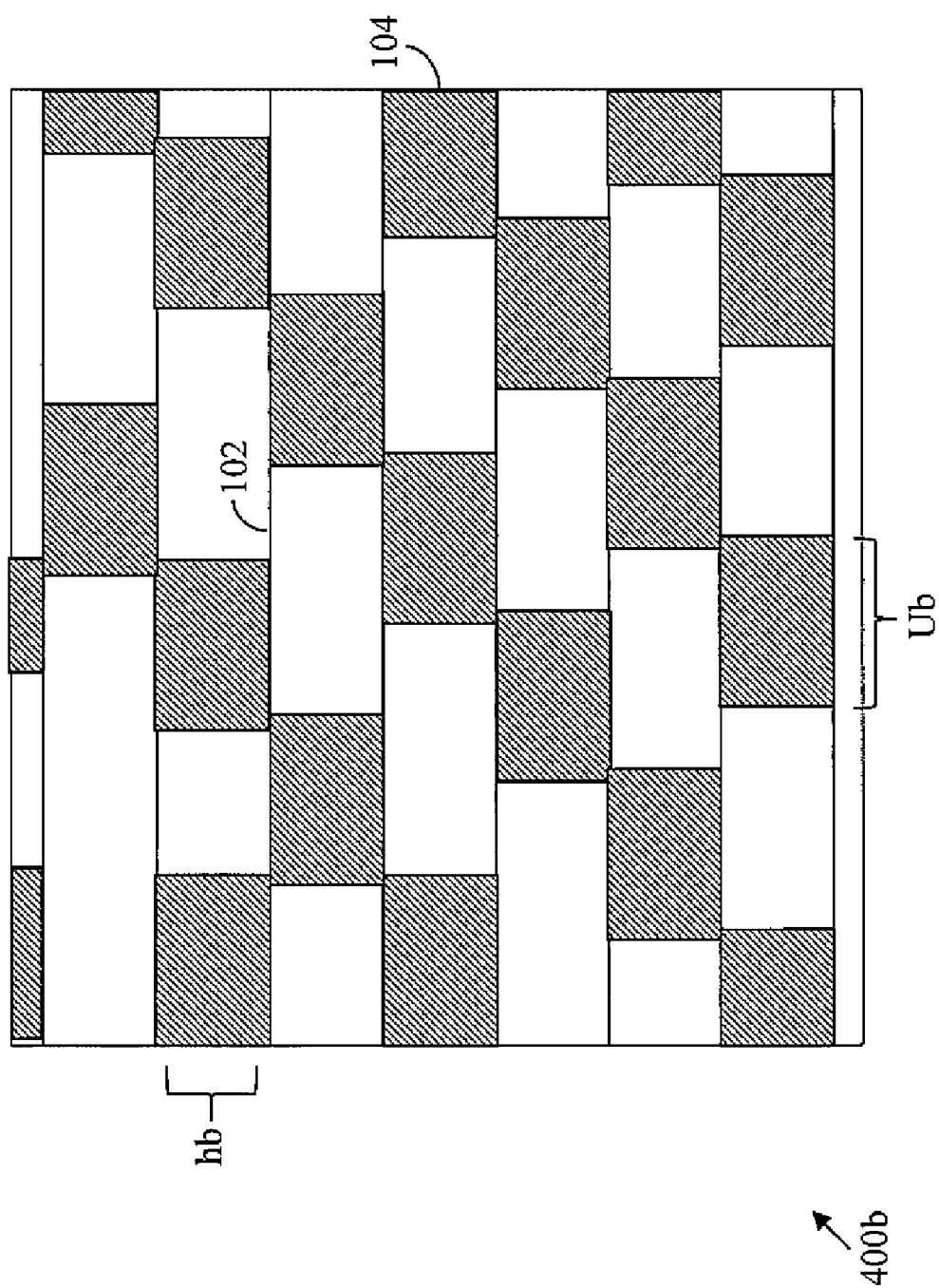
Figure 4C:
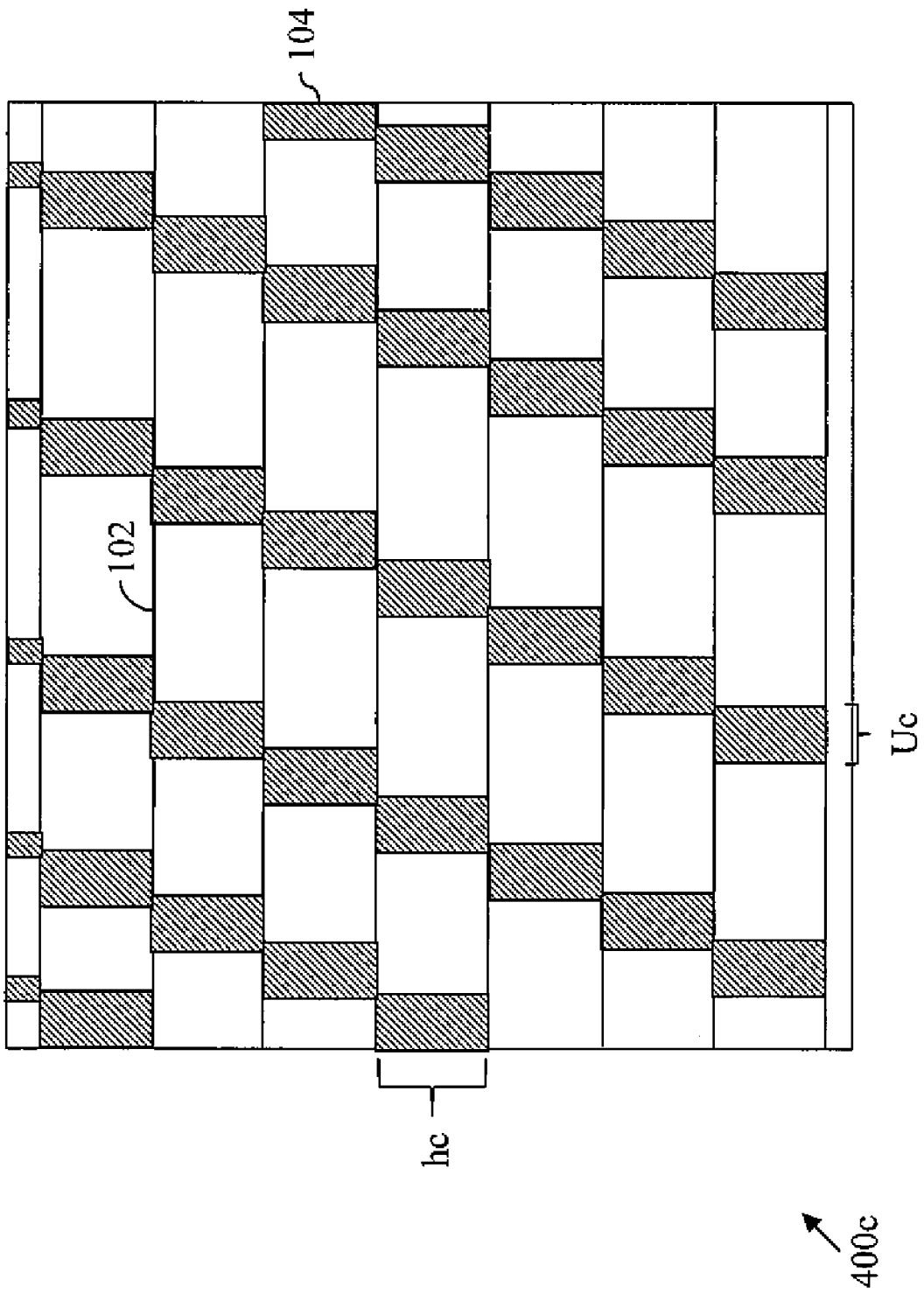

Referring now to FIGS. 4A-4C, schematic diagrams of layout patterns 400a, 400b and 400c in accordance with an embodiment of the present invention are illustrated (the layout patterns 400a-400c may be referred to collectively herein as layout pattern 400). The layout pattern 400a corresponds to a scenario where a value of vertical congestion is equal to a value of horizontal congestion. This may be inferred from the fact that a width Ua of the keep-out region 104 is equal to a height ha of the keep-out region 104. Further, the layout pattern 400b (FIG. 4B) illustrates a scenario where the value of vertical congestion is less than the value of horizontal congestion. This may be inferred from the fact that a width Ub of the keep-out region 104 is greater than a height hb of the keep-out region 104. Still further, the layout pattern 400c (FIG. 4C) corresponds to a scenario where the value of vertical congestion is greater than the value of horizontal congestion. This may be inferred from the fact that a width Uc of the keep-out region 104 is less than a height hc of the keep-out region 104.

Figure 5:
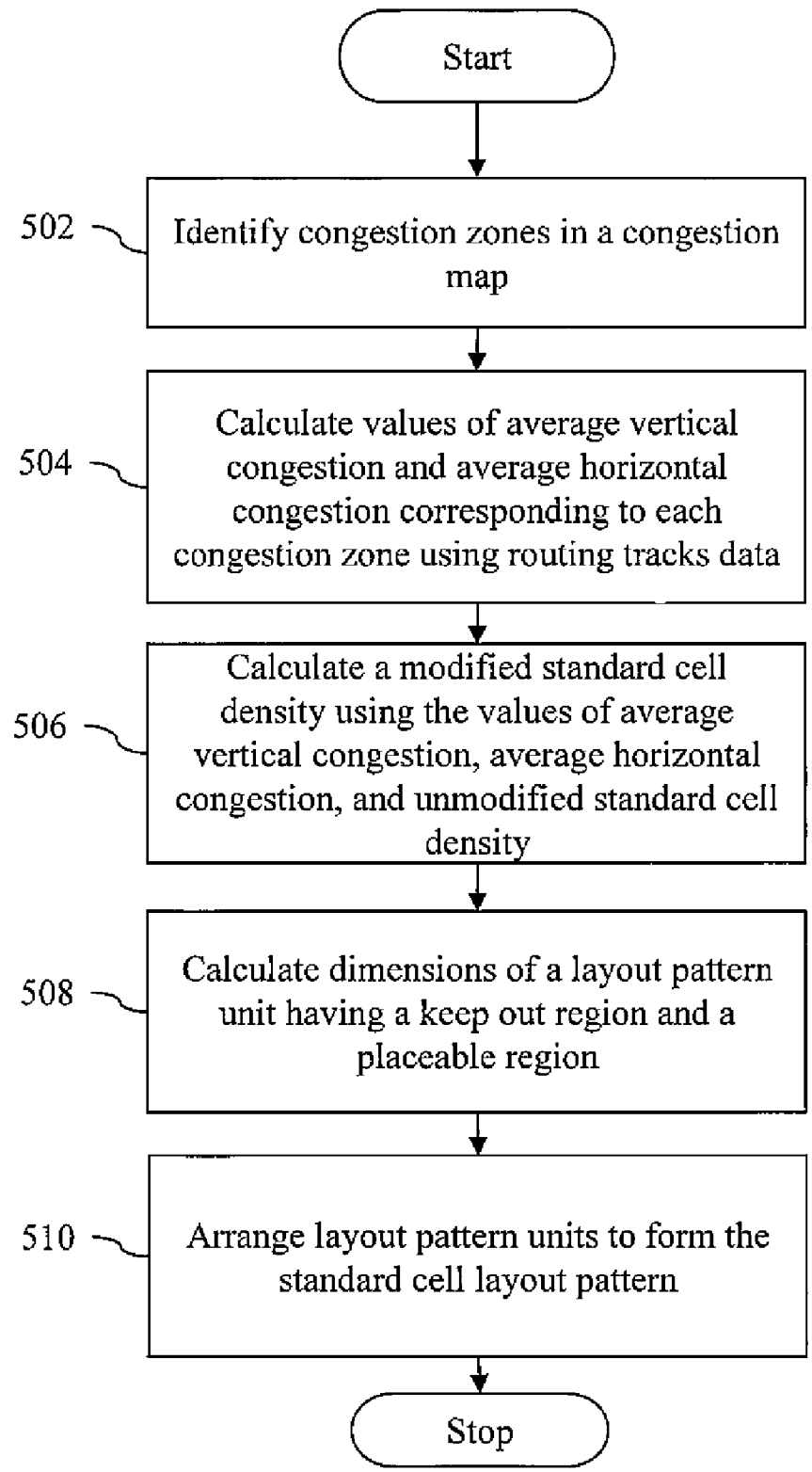
FIG. 5 is a flow chart illustrating a method for generating a standard cell layout pattern for standard cell placement in an IC.

Referring now to FIG. 5, a flow chart 500 illustrating a method for generating a standard cell layout pattern for standard cell placement in an integrated circuit is shown in accordance with an embodiment of the present invention.

At step 502, one or more congestion zones are identified in a congestion map. In an embodiment of the present invention, the congestion zones are identified by visual observation of the congestion map. The congestion map is generated by an EDA tool used for the routing and placement of the netlist. The congestion map is generated based on a layout pattern provided by the EDA tool. As previously discussed, tools that can generate congestion maps are commercially available and known by those of skill in the art. Thereafter, various steps of the method of the present invention alter the layout pattern in a manner to eliminate congestion in the layout pattern generated by the EDA tool. For example, referring to FIG. 2, congestion zones 206a and 206b are identified through visual observation of the congestion map 200. Further, the congestion map 200 is composed of several bounding boxes such as the bounding box 208. Each bounding box is a portion of a congestion zone and has a predetermined length and a predetermined width. For example, the bounding box 208 is a portion of the congestion zone 206a and the size of the bounding box 208 is 50 μm by 100 μm. The EDA tool provides routing tracks data corresponding to each bounding box belonging to the congestion map 200.

At step 504, values of average vertical and horizontal congestions are calculated for the congestion zone using the routing tracks data corresponding to each bounding box, such as the bounding box 208, of the congestion zone. The EDA application provides routing tracks data corresponding to each bounding box, such as the bounding box 208, in the form of a congestion table as depicted below in Table 1.

TABLE 1

| Routing Tracks Data | | | |
|---|---|---|---|
| Area co-ordinates | | Vertical tracks remaining/available | Horizontal tracks remaining/available |
| (5, 100) | (55, 200) | V: −6/18 | H: 2/10 |
| (55, 100) | (105, 200) | V: 1/18 | H: −3/10 |
| (105, 100) | (155, 200) | V: −5/18 | H: −1/10 |

The negative values of a count of routing tracks remaining depict a shortage of routing tracks or an additional number of routing tracks required ($H_{required}$, $V_{required}$) for routing the desired number of nets. Further, a count of routing tracks available ($H_{avalaible}$, $V_{avalaible}$) depicts a total number of routing tracks available for routing nets. For example, the table entry 'V:-6/18' means that six additional vertical routing tracks are required, while the total count of vertical routing tracks available for routing is eighteen (18). The table entries corresponding to the horizontal direction may be similarly interpreted. Ratios of sum of the count of additional routing tracks required and the count of routing tracks available to the count of routing tracks available are calculated for horizontal as well as for vertical directions. The calculation of ratios may be mathematically represented as follows:

$$H_i = \frac{(H_{required} + H_{available})}{H_{available}}$$

(where $i = 1, 2, 3, \ldots n$)

$$V_j = \frac{(V_{required} + V_{available})}{V_{available}}$$

(where $j = 1, 2, 3, \ldots p$)

Subsequent to obtaining the horizontal and vertical ratios, the values of the average horizontal and vertical congestions, 'H' and 'V' respectively, are calculated for each congestion zone. For calculating 'H' and 'V', for each congestion zone, arithmetic means of the above obtained horizontal and vertical ratios are obtained as follows:

$$H = \frac{H_1 + H_2 + H_3 + \ldots H_n}{n}$$

$$V = \frac{V_1 + V_2 + V_3 + \ldots V_p}{p}$$

At step 506, a value of a modified standard cell density, $D_{Mod}$, for each congestion zone is calculated using corresponding values of 'H', 'V', and unmodified standard cell density, $D_0$. The unmodified standard cell density is the standard cell density in the congestion zone prior to the application of the presently described method. In an embodiment of the present invention, the unmodified standard cell density is provided by the EDA application. The calculation of the modified standard cell density may be mathematically represented as follows:

$$D_{Mod} = \frac{D_0}{H \times V}$$

At step 508, the dimensions of a layout pattern unit are calculated using width of the layout pattern unit and the modified standard cell density, $D_{Mod}$. Referring to FIG. 3A, which depicts width, 'h', length 'S' of a placement region, length 'U' of a keep-out region of the layout pattern unit 300. Length 'U' of the keep-out region may be calculated as follows:

$$\frac{h}{U} = \frac{V}{H} \qquad (i)$$

$$U = h \bigg/ \frac{V}{H} \qquad (ii)$$

It should be realized by persons skilled in the art that the width 'h' of the layout pattern unit 300 is the width of a standard cell, which is dependant on the technology on which the standard cells are based and thus will be same for the standard cells based on a particular technology. Further, length 'S' of the placement region may be calculated as follows:

$$S = \frac{U \times D_{Mod}}{1 - D_{Mod}} \qquad (iii)$$

To round off the length, 'S', such that the placement region is large enough to accommodate standard cell with largest length, $L_{Max}$, a multiplication factor, 'M', is calculated as follows:

$$M = \text{Integer}[(L_{Max}/S) + 1] \qquad (iv)$$

Using the multiplication factor, 'M', the dimensions of the layout pattern unit may be calculated using equations (i), (ii), (iii), and (iv) as follows:

$$h' = M \times h$$

$$U' = M \times U = M \times h \bigg/ \frac{V}{H}$$

$$S' = M \times S = M \times \frac{U \times D_{Mod}}{1 - D_{Mod}}$$

At step 510, various layout pattern units are arranged adjacent to one another to form a layout pattern. Referring FIG. 3B, the partial layout pattern 302 is formed by arranging several of the layout pattern units (refer FIG. 3A) adjacent to one another. The layout pattern units are placed such that the overlap width 304 (refer FIG. 3B) for the keep-out regions of two adjacent layout patterns is at least one routing track width. Thereafter, the standard cells are placed in accordance with the layout pattern generated using the above described method.

Further, the width to length proportion of the keep-out region and the placement region address directional congestions, i.e., horizontal congestion or vertical congestion. For example, when the average vertical congestion is more than the average horizontal congestion, i.e. 'V'>'H' therefore in accordance with equation (i), 'h'>'U', therefore a keep-out pattern so formed has more free vertical tracks as compared to free horizontal tracks, which reduces the value of average vertical congestion. Similar analyses may be performed for the cases when 'V'<'H', and 'V'='H'. Referring to FIGS. 4A, 4B, and 4C, the layout patterns corresponding to above enumerated scenarios have been illustrated. For example, referring to FIG. 4A, the layout pattern 400 corresponds to the case when the value of average vertical congestion is equal to the value of the horizontal congestion. Further, referring to FIG. 4B, the layout pattern 400 corresponds to the case when the value of average horizontal congestion is greater than the value of average vertical congestion. Referring to FIG. 4C, the layout pattern 400 corresponds to the case when the value of average horizontal congestion is less than the value of average vertical congestion.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A method for generating a standard cell layout pattern for standard cell placement in an integrated circuit, comprising:

identifying one or more congestion zones in a congestion map, wherein the congestion map is generated by an Electronic Design Automation (EDA) tool and includes a plurality of bounding boxes, and wherein the EDA tool generates routing tracks data corresponding to each bounding box;

calculating values of an average vertical congestion (H) and an average horizontal congestion (V) corresponding to each of the identified congestion zones using the routing tracks data;

calculating a value of a modified standard cell density for at least one of the identified congestion zones using the values of the average vertical congestion (V), the average horizontal congestion (H), and an unmodified standard cell density ($D_0$), wherein calculation of the modified standard cell density ($D_{mod}$) is mathematically represented as $D_{mod}=D_0/H \times V$, and wherein the unmodified standard cell density is generated by the EDA application;

calculating dimensions of a layout pattern unit, wherein the layout pattern unit comprises a keep-out region and a placement region, wherein one or more standard cells are placed in the placement region, and wherein the keep-out region comprises one or more routing tracks; and arranging one or more layout pattern units to form the standard cell layout pattern, wherein at least one routing track in a keep-out region of a first layout pattern unit overlaps with at least one routing track in a keep-out region of a second layout pattern unit.

2. The method for generating a standard cell layout pattern of claim 1, wherein the routing tracks data comprises a count of horizontal routing tracks and vertical routing tracks available for routing one or more nets corresponding to each bounding box.

3. The method for generating a standard cell layout pattern of claim 2, wherein the routing tracks data further comprises a count of horizontal routing tracks and vertical routing tracks required for routing the one or more nets corresponding to each bounding box.

4. The method for generating a standard cell layout pattern of claim 3, wherein the value of the average vertical congestion is the arithmetic mean of ratios of a sum of the count of vertical routing tracks required and the count of vertical routing tracks available to the count of vertical routing tracks available corresponding to the bounding boxes of the one or more congestion zones.

5. The method for generating a standard cell layout pattern of claim 4, wherein the value of the average horizontal congestion is the arithmetic mean of ratios of a sum of the count of horizontal routing tracks required and the count of horizontal routing tracks available to the count of horizontal routing tracks available corresponding to the bounding boxes of the one or more congestion zones.

6. The method for generating a standard cell layout pattern of claim 5, wherein the modified standard cell density is a ratio of the unmodified standard cell density to a product of the average horizontal congestion and the average vertical congestion.

7. The method for generating a standard cell layout pattern of claim 1, wherein the dimensions of the layout pattern unit comprise a length of the keep-out region and a length of the placement region.

8. The method for generating a standard cell layout pattern of claim 1, wherein a bounding box comprises a portion of a congestion zone having a predetermined length and a predetermined width.

9. The method for generating a standard cell layout pattern of claim 1, wherein the routing tracks data used to calculate the average vertical and horizontal congestion values corresponds to the bounding boxes of the identified congestion zones.

* * * * *